United States Patent
Yang et al.

(10) Patent No.: US 7,795,674 B2
(45) Date of Patent: Sep. 14, 2010

(54) DUAL GATE LDMOS DEVICES

(75) Inventors: Hongning Yang, Chandler, AZ (US); Veronique C. Macary, Chandler, AZ (US); Won Gi Min, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/560,588

(22) Filed: Sep. 16, 2009

(65) Prior Publication Data

US 2010/0025765 A1 Feb. 4, 2010

Related U.S. Application Data

(62) Division of application No. 11/626,928, filed on Jan. 25, 2007, now Pat. No. 7,608,513.

(51) Int. Cl.
*H01L 29/78* (2006.01)
(52) U.S. Cl. ............................. 257/336; 257/E29.256
(58) Field of Classification Search ............... 257/337
See application file for complete search history.

(56) References Cited

U.S. PATENT DOCUMENTS

| 5,907,173 | A | 5/1999 | Kwon et al. |
|---|---|---|---|
| 6,566,710 | B1 * | 5/2003 | Strachan et al. ............ 257/341 |
| 6,825,531 | B1 | 11/2004 | Mallikarjunaswamy |
| 6,914,294 | B2 * | 7/2005 | Nakamura et al. .......... 257/328 |
| 2003/0173624 | A1 | 9/2003 | Choi et al. |
| 2005/0067655 | A1 | 3/2005 | Shibib et al. |
| 2005/0082610 | A1 | 4/2005 | Shibib et al. |
| 2006/0113601 | A1 | 6/2006 | Shibib et al. |
| 2008/0121997 | A1 | 5/2008 | Yang |

* cited by examiner

*Primary Examiner*—Chandra Chaudhari
(74) *Attorney, Agent, or Firm*—Ingrassia, Fisher & Lorenz, P.C.

(57) ABSTRACT

An embodiment of an N-channel device has a lightly doped substrate in which adjacent or spaced-apart P and N wells are provided. A lateral isolation wall surrounds at least a portion of the substrate and is spaced apart from the wells. A first gate overlies the P well or the substrate between the wells or partly both. A second gate, spaced apart from the first gate, overlies the N-well. A body contact to the substrate is spaced apart from the isolation wall by a first distance within the space charge region of the substrate to isolation wall PN junction. When the body contact is connected to the second gate, a predetermined static bias Vg2 is provided to the second gate, depending upon the isolation wall bias (Vbias) and the first distance.

20 Claims, 9 Drawing Sheets

DUAL GATE LDMOS DEVICES

RELATED APPLICATION

This application is a divisional of co-pending U.S. application Ser. No. 11/626,928.

TECHNICAL FIELD

Embodiments of the present invention generally relate to semiconductor devices and methods for fabricating semiconductor devices, and more particularly relate to laterally diffused metal-oxide-semiconductor devices (LDMOS) employing dual gates.

BACKGROUND

Processing technologies and device structures for forming integrated circuits (ICs) are implemented by using a plurality of interconnected field effect transistors (FETs), also called metal oxide semiconductor field effect transistors (MOS-FETs), or simply MOS transistors or devices. A well known sub-set of MOS transistors are referred to as laterally diffused metal oxide semiconductor (LDMOS) transistors or devices. Although the term "MOS device" properly refers to a device having a metal gate electrode and an oxide gate insulator, that term will be used throughout to refer to any semiconductor device that includes a conductive gate electrode (whether metal or not) that is positioned over a gate insulator (whether oxide or other dielectric material) which, in turn, is positioned over a semiconductor surface. Accordingly, the terms metal-oxide-semiconductor and the abbreviation "MOS" are used herein even though such devices may not employ just metals or oxides but combinations of conductive materials, e.g., alloys, silicides, doped semiconductors, etc., instead of simple metals, and insulating materials other than oxides (e.g., nitrides, oxy-nitride mixtures, etc.). Thus, as used hereon the terms MOS and LDMOS are intended to include such variations.

A typical MOS transistor includes a gate electrode as a control electrode and spaced-apart source and drain electrodes between which a current can flow. A control voltage applied to the gate electrode controls the flow of current through a controllable conductive channel between the source and drain electrodes. In an LDMOS device, a drift space is provided between the channel region and the drain region. For convenience of description and not intended to be limiting, N-channel LDMOS devices are illustrated herein, but persons of skill in the art will understand that the present invention is not limited merely to N-channel devices and that P-channel and other types of devices may be provided by, for example, substitution of semiconductor regions of opposite conductivity type.

FIG. 1 is a simplified schematic cross-sectional view through LDMOS device 20 according to the prior art. Device 20 is formed in a semiconductor and comprises optional N-type buried layer (NBL) 21 and P-type substrate (P-SUB) 22, in which have been formed N-type drift space or region 24 and P-well 26 having PN junction 25 therebetween, extending to surface 27. N+ drain 28 is formed in N-drift space 24 and N+ source 30 is formed in P-well 26. P+ body and P-well contact region 31 is also typically provided in P-well 26. P-type buried layer (PBL) 23 may also be included but is not essential. Gate dielectric 34, e.g., silicon oxide, is formed on surface 27. Gate 36 is provided on dielectric 34 extending laterally approximately from source 30 to and overlapping N-drift space 24. Intermediately doped N-type diffused region 32 may also be provided extending from source 30 under the edge of gate 36 to insure that a high resistance region does not exist between source 30 and channel 35 in P-well 26 through which flows source-drain current Id. Dielectric side-wall spacers 37 and 38 are provided covering lateral edges 361-362 of gate 36. Sidewall spacer 38 also extends over portion 271 of surface 27 above N-drift space 24 to drain 28. Portion 271 also corresponds to the gate-drain separation distance. Portion 381 of spacer 38 between gate edge 362 and drain region 28 is often referred to as a "silicide blocker" since its function is, among other things, to prevent a silicide layer (not shown) often used for making ohmic contacts to source-drain regions 30, 28 from shorting out portion 271 of surface 27. Intermediately doped N-type region 29 is often provided extending from drain region 28 a short distance toward gate 36 to assist in controlling the electric field near drain region 28. Conductive contact 33 and terminal 331 are provided in ohmic contact with drain region 28. Conductive contact 39 with terminal 391 is provided in ohmic contact with source region 30 and P-well and substrate contact region 31. Gate terminal 363 is provided electrically coupled to gate 36.

5 to 10 volt LDMOS devices are widely used in wireless applications. 7.5 volt (and higher voltage) LDMOS devices are expected to be among the next generation of high frequency (>4 MHZ) power switches to replace the current generation 5 volt MOSFET devices that have potential reliability issues due to transient drain voltage overshoot at high frequencies. Shrinking LDMOS device sizes is a key requirement to obtain both high performance and lower cost. However, major design and process problems prevent current day LDMOS devices from being further shrunk below about 0.5 µm process technology. Breaking through the 0.5 µm barrier into 0.13 µm technology and below involves serious challenges, for example, misalignment errors, hot carrier injection (HCI) and leakage issues. Accordingly, there is an ongoing need to provide improved LDMOS devices structures and manufacturing processes that mitigate or avoid these and other problems encountered with current generation devices.

Accordingly, it is desirable to provide a new type of deep submicron semiconductor device, and more particularly, deep submicron LDMOS devices and methods able to operate at voltages above 5 volts. In addition, it is desirable to provide a structure and method for fabricating deep submicron LDMOS devices of improved performance below the current minimum channel length of 0.5 µm. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

Embodiments will hereinafter be described in conjunction with the following drawing figures, wherein like numerals denote like elements, and wherein.

DETAILED DESCRIPTION

Figure 1:
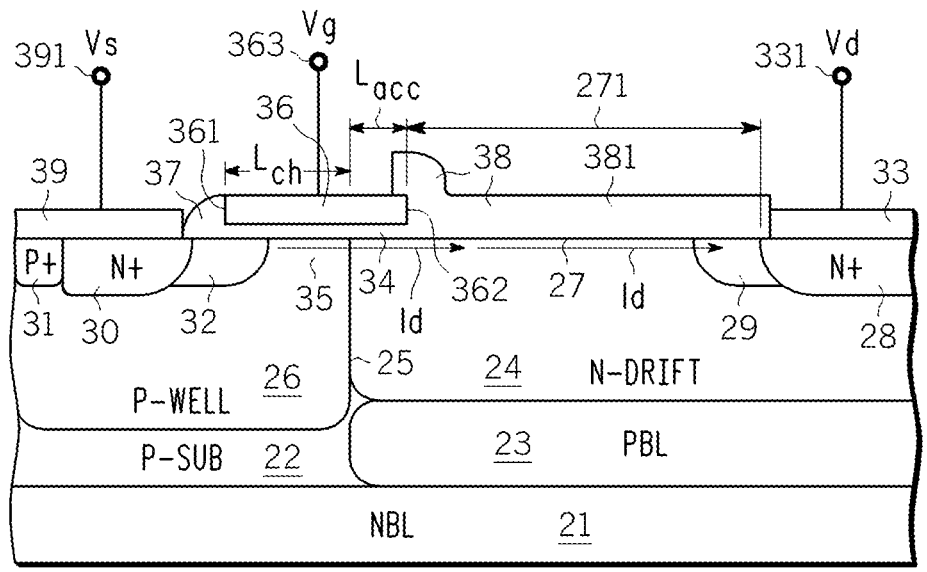
FIG. 1 is a simplified schematic cross-sectional view through an LDMOS device according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "in," "out," "front," "back," "up," "down," "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

Referring again to FIG. 1, the channel length $L_{ch}$ and the accumulation length $L_{acc}$ are typically defined by non-self aligned ion implantations. The minimum $L_{ch}$ is generally limited to 0.5 µm due to lithographic misalignment error. Attempting to use silicide block region 381 and thin gate oxide 34 (e.g., ≦100 Angstrom Units) in 0.13 µm technology causes enhanced hot carrier injection (HCI) degradation even for LDMOS devices that have longer $L_{ch}$. HCI problems with conventional LDMOS devices grow worse as device dimensions are shrunk further and operating voltages are increased. An improved structure and fabrication method are needed to mitigate these problems.

Figure 2:
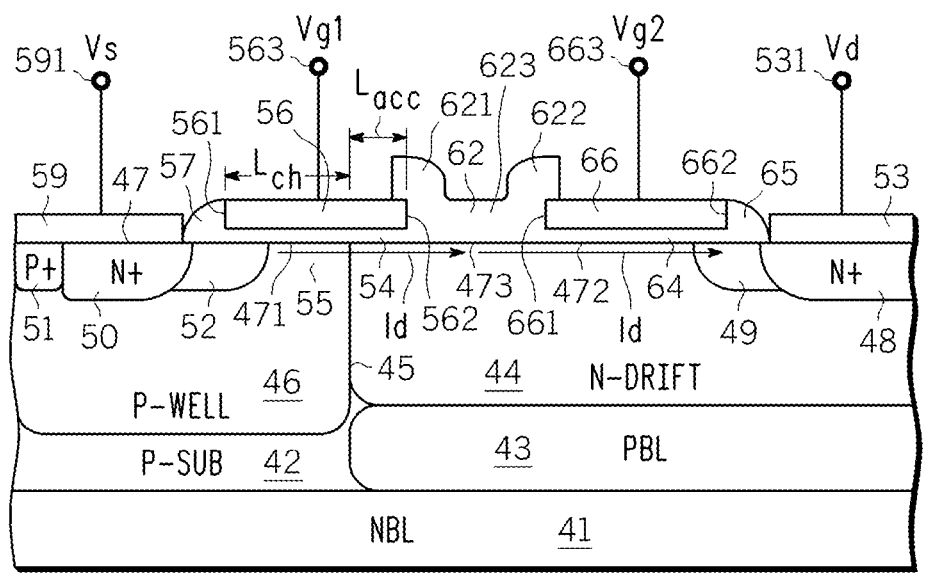
FIG. 2 is a simplified schematic cross-sectional view through an LDMOS device employing dual gates, according to an embodiment of the invention.

FIG. 2 is a simplified schematic cross-sectional view through dual gate LDMOS device 40 according to an embodiment of the invention. For convenience of description, N-channel devices are illustrated, but this is not intended to be limiting and persons of skill in the art will understand based on the description herein that P-channel devices may also be formed by interchanging conductivity types. Device 40 is formed in a semiconductor and comprises P-type substrate 42, in which have been formed N-type drift space 44 (hereafter N-drift 44) and P-well 46 having PN junction 45 therebetween, extending to surface 47. N-type buried layer (NBL) 41 and P-type buried layer (PBL) 43 may also be included in various embodiments but are not essential to the invention. N+ drain region 48 is formed in N-drift 44 and N+ source region 50 is formed in P-well 46. P+ contact region 51 is also typically provided in P-well 46 to facilitate contact thereto and to P-substrate (P-SUB) 42. Gate dielectric 54, e.g., silicon oxide, is formed on portion 471 of semiconductor surface 47 between source 50 and N-drift space 44. Gate 56 is provided on dielectric 54 extending laterally approximately from source 50 to and overlapping N-drift 44. Intermediately doped N-type diffused region 52 may also be provided in various embodiments, extending from source 50 under edge 561 of gate 56 to insure that a high impedance region does not exist between source 50 and channel 55 in P-well 46. Region 52 is analogous to region 32 of FIG. 1. Source-drain current Id flows from source 50 through channel 55 to drain 48. Dielectric side-wall spacer 57 is desirably provided covering lateral edge 561 of gate 56 and side-wall spacer 621 is provided covering lateral edge 562 of gate 56.

Device 40 differs from device 20 in that device 40 has two gates, that is, control gate (i.e., first gate) 56 analogous to gate 36 of device 20 and HCI suppression gate (i.e., second gate) 66 spaced apart from first gate 56 and located above portion 472 of surface 47 of N-drift 44 proximate to drain region 48. First gate 56 and second gate 66 are separated by dielectric silicide blocker region 62. Blocker region 62 includes sidewall spacer portion 621 covering lateral edge 562 of first gate 56, sidewall spacer portion 622 covering lateral edge 661 of second gate 66, and portion 623 covering portion 473 of surface 47 between gates 56 and 66. Second gate 66 is separated from portion 472 of surface 47 of N-drift region 44 by second gate dielectric (e.g., oxide) 64 of the same or different thickness than first gate dielectric 54. Dielectric sidewall spacer 65 is provided covering lateral edge 662 of second gate 66. Intermediately doped N-type region 49 is desirably but not essentially provided extending from drain region 48 a short distance toward gate 56 to assist in controlling the electric field near drain region 48. Regions 49 and 52 desirably have the same conductivity type and about the same doping concentration, for example, and not intended to be limiting, greater than the doping concentration of N-drift 44 and less than the doping concentration of drain 48 and/or source 50. Conductive contact 53 and terminal 531 are provided in ohmic contact with drain region 48. Conductive contact 59 with terminal 591 is provided in ohmic contact with source region 50 and body contact region 51 to P-well 46, which is in contact with P-substrate 42. Gate terminal 563 is electrically coupled to first gate 56. Gate terminal 663 is electrically coupled to second gate 66. With voltage Vd (e.g., 7.5 volts) applied to drain terminal 531 relative to voltage Vs (e.g., 0 volts) applied to source terminal 591 and with a control signal Vg1 applied to control gate terminal 563 that exceeds the device threshold voltage Vt, source-drain current Id flows from source 50 through channel 55 in P-well 46 and through N-drift 44 to drain 48.

Figure 3:
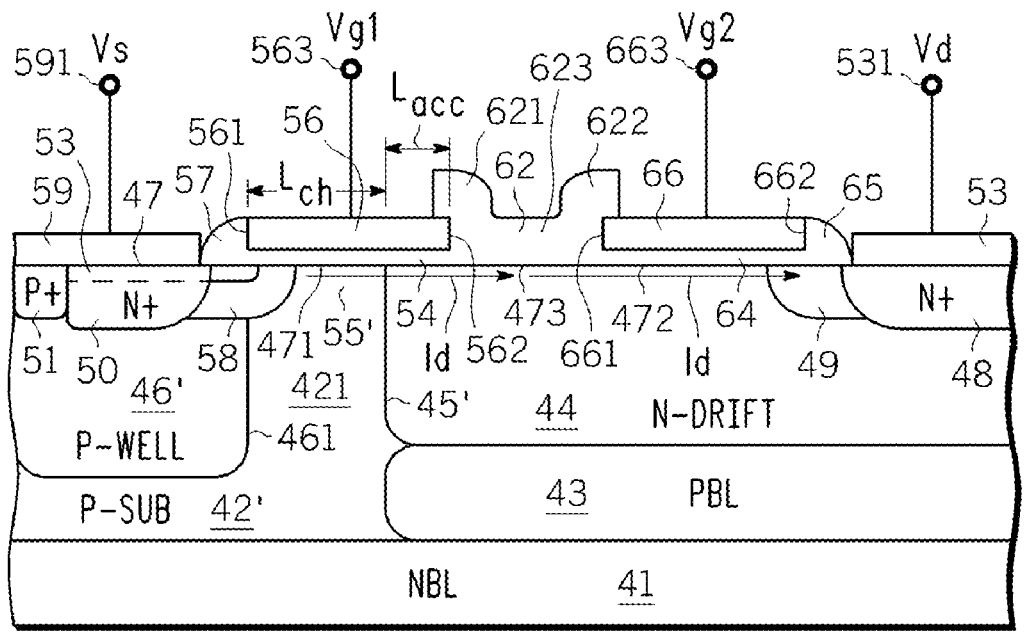
FIG. 3 is a simplified schematic cross-sectional view through an LDMOS device employing dual gates, according to a further embodiment of the invention.

FIG. 3 is a simplified schematic cross-sectional view through LDMOS device 60 employing dual gates, according to a further embodiment of the invention. Like reference numbers are used to identify like regions in device 40 of FIG. 2 and device 60 of FIG. 3, and the description thereof in connection with FIG. 2 is incorporated herein by reference. Primed reference numbers are used to identify regions generally analogous to the same (un-primed) reference numbers in FIG. 2, but which may have somewhat different geometry and doping. Device 60 differs from device 40 in that P-well 46' does not extend to N-drift 44, but has rightward boundary 461 that is aligned approximately with lateral edge 561 of gate 56, but this is not critical. Rightward boundary 461 may be displaced to the left or right of lateral edge 561 of gate 56 provided it does not intersect PN junction 45' formed between doped P-substrate region (P-SUB) 42' and N-drift 44. P-SUB 42' is analogous to P-SUB region 42 of device 40, but is desirably of somewhat different geometry. For example, P-SUB 42' of device 60 has portion 421 that extends to portion 471 of surface 47 between source 50 and N-drift 44 so that channel 55' is formed therein, rather than in P-well 46 as illustrated in device 40. First gate 56 is located above portion 421 of P-SUB region 42' (and portion 471 of surface 47). Second gate 66 is positioned above N-drift 44 in much the same manner as with device 40. Region 58 extending from source 50 under lateral edge 561 is desirably P-type formed by an angled implant, commonly referred to as a HALO implant, but this is not essential to the invention. When a HALO implant is used for region 58, it is desirable to include N-type implant region 53 in source region 50, extending into region 58 at least to lateral edge 561 of gate 56.

Figure 4:
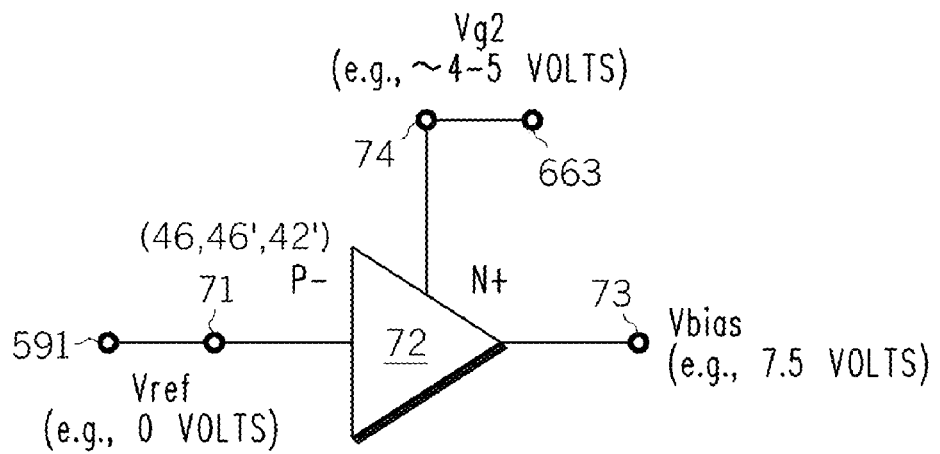
FIG. 4 is a simplified electrical schematic diagram illustrating how a reverse biased PN junction is used to obtain the desired voltage bias (Vg2) on a second gate (G2) provided in embodiments of the invention.

FIG. 4 shows simplified electrical schematic diagram 70 illustrating how reverse biased PN junction 72 is used to provide the desired voltage bias (Vg2) on second gate (G2) 663, in various embodiments of the invention. PN junction 72 has P-side terminal 71 which is coupled, for example, to terminal 591 of device 40, 60 and N-side terminal 73 that is coupled to a voltage source Vbias that is desirably equal or greater than the maximum device voltage Vdmax. By way of example and not intended to be limiting, when 7.5 volts is the maximum operating voltage of the device, Vbias~7.5 volts is a suitable voltage for connection to N-side terminal 73. Terminal 71 is desirably coupled to reference voltage source Vref. When terminal 71 is coupled to terminal 591 of device 40, 60, then Vref=Vs (e.g., 0 volts). For N-channel LDMOS devices, it is important that PN junction 72 have a comparatively heavily doped N-side and a comparatively lightly doped P-side. Stated another way, it is desirable for N-channel devices that the N-side doping be about $10^1$ or more greater and preferably about $10^2$ or more greater than the P-side doping of the PN junction, and vice-versa for P-channel devices. This insures that (for N-channel devices) the space-charge region of PN junction 72 extends primarily in the P-side, e.g., into regions 42, 42' or a combination of regions 42, 42' and and/or 46, 46' of devices 40, 60. The space-charge region of a biased PN junction can be used as a voltage divider. Connection 74 is located in the space-charge region and therefore provides a voltage Vg2 that is intermediate between Vref=Vs (e.g., 0 volts) and Vbias (e.g., 7.5 volts). Connection 74 is coupled to connection 663 of second gate 66. Since second gate (G2) 66 is insulated from surface 47, no DC current flows through second gate 66 and therefore the space-charge region of PN junction 72 may be used as a voltage source to bias second gate 66. Useful locations of PN junction 72 and bias contacts 74, 663 are illustrated, by way of example and not intended to be limiting, in conjunction with FIGS. 5-6 and 7-17.

Figure 5:
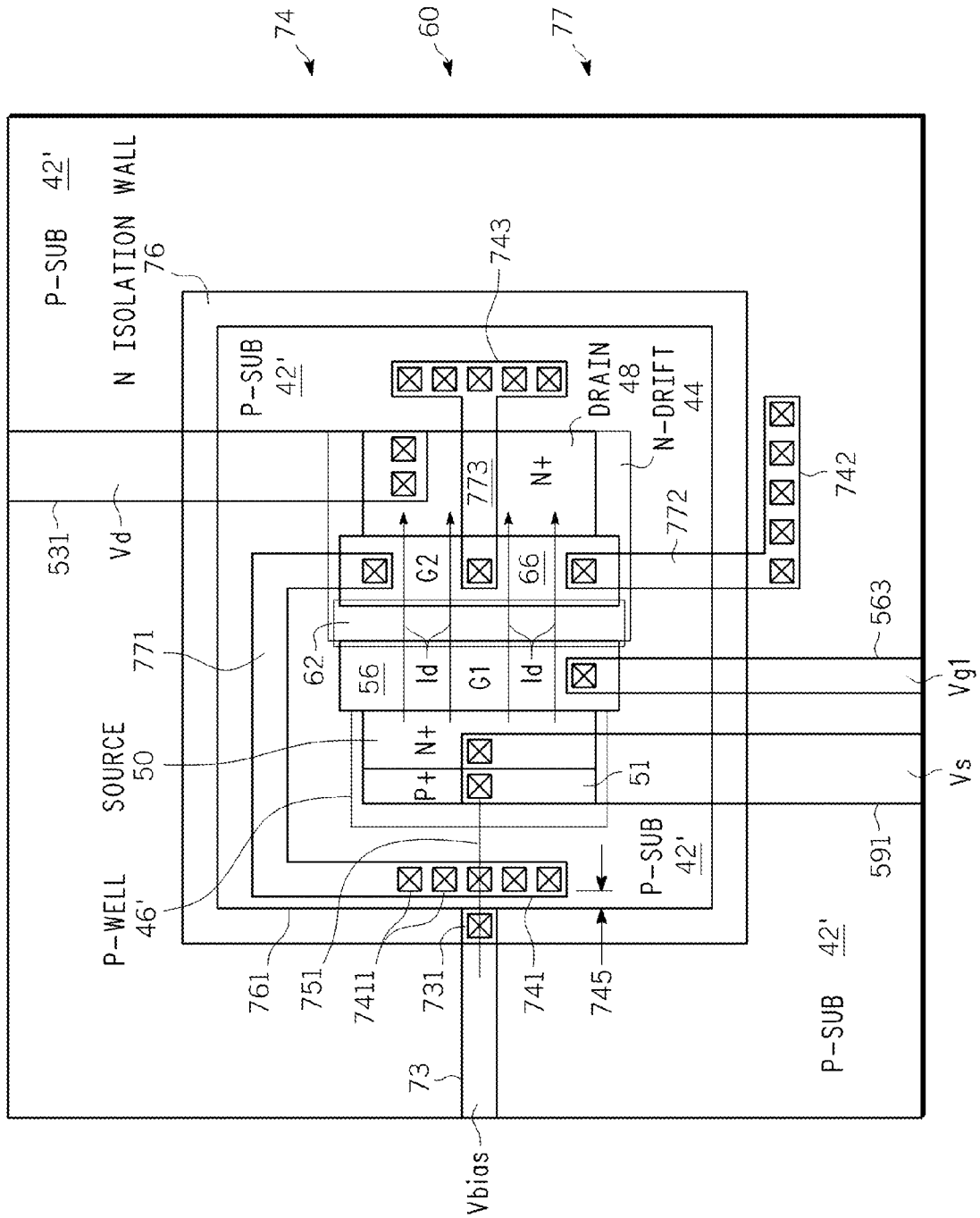
FIG. 5 is a simplified schematic plan view of a device of the type illustrated in FIG. 3, showing arrangements for obtaining the desired second gate bias voltage (Vg2), according to various embodiments of the invention.

FIG. 5 shows simplified schematic plan view 75, by way of example and not intended to be limiting, of a device of the type shown in FIG. 3, illustrating several arrangements for obtaining the desired second gate bias voltage Vg2, according to various embodiments of the invention. It will be understood by those of skill in the art that FIG. 5 is not necessarily representative of how device 60 may be implemented as part of a complex integrated circuit but rather is intended to illustrate in a schematic fashion how different regions adjacent device 60 may be used to provide the desired second gate bias voltage Vg2. The principal regions of device 60 are shown in plan view 75, but various details are omitted in order to avoid unduly cluttering the drawing. FIG. 5 is intended to show the relative locations of various device regions rather than their exact size and shape. Device 60 comprises P-SUB region 42', P-well 46', N-drift 44, N+ source region 50, P+ contact region 51 for P-well 46' and P-SUB region 42', drain region 48, first gate (G1) 56, second gate (G2) 66, silicide blocking region 62, connection 531 to drain 48, connection 591 to source 50 and P-well region 46' (which in turn is coupled to P-SUB region 42'), and control gate (first gate) connection 563. N-type isolation wall 76 is shown surrounding device 60, separated from P-well 46' and N-drift 44 and the device active regions by P-SUB region 42'. For convenience of illustration it is assumed that P-SUB region 42' also exists laterally outside of N-type isolation wall 76, and is at potential Vref (e.g., Vref=Vs=0 volts). This can be accomplished by, for example and not intended to be limiting, providing a contact (not shown) to P-SUB region 42' from source and P-body contact lead 591 or by other means coupled to Vref as will occur to those of skill in the art. In normal operation Vbias is applied via connection 73 to N-type isolation wall 76, Vs=Vref is applied to source 50 and P body contact 51 via connection 591, Vg1 is applied to first gate 56 via connection 563 and drain voltage Vd is applied to drain connection 531. When appropriately biased, source-drain current Id flows from source 50 to drain 48 as shown in FIG. 5. Ohmic connections are indicated in FIG. 5 by the symbol "x" surrounded by a small box. Vg2 is derived by providing ohmic connection 74 (e.g., 741, 742 or 743) to the space-charge region of one or the other of the reversed biased PN junctions that exist around device 60 and coupling these connections to second gate 66 by leads 77, (e.g., 771, 772 or 773). Three non-limiting examples are shown for connections 74 to PN junction space charge regions: (1) connection 741 located in P-SUB region 42' between N-type isolation wall 76 and P-well 46' and coupled to second gate 66 by lead 771; (2) connection 742 located in P-SUB region 42' outside of N-type isolation wall 76 and coupled to second gate 66 by lead 772, and (3) connection 743 located in P-SUB region 42' near drain region 48 and coupled to second gate 66 by lead 773. These three examples of different connection locations 741, 742, 743 for obtaining Vg2 are intended to illustrate alternative locations for connection 74 in FIG. 4, that is, one can obtain Vg2 by providing connection 74 at location 741 or 742, or 743, or other sites where a space charge region of the appropriate polarity is available near the device. Only one connection would actually be provided associated with device 40 or 60, and showing several connection examples 741, 742, 743 in FIG. 5 is merely for economy of illustration. Connection locations 741 and 742 provide Vg2 substantially independent of Vd. Connection location 743 will be influenced by Vd and will rise and fall with Vd. Either arrangement is useful. Connection locations or connections 741, 742, 743 are referred to collectively as connections 74, and leads 771, 772, 773 are referred to collectively as leads 77. Since no DC current flows through leads 77 except that needed to charge the capacitance created by second gate 66 and underlying dielectric 64, once power is applied to device 60, the desired bias Vg2 is maintained on second gate 66.

Figure 6:
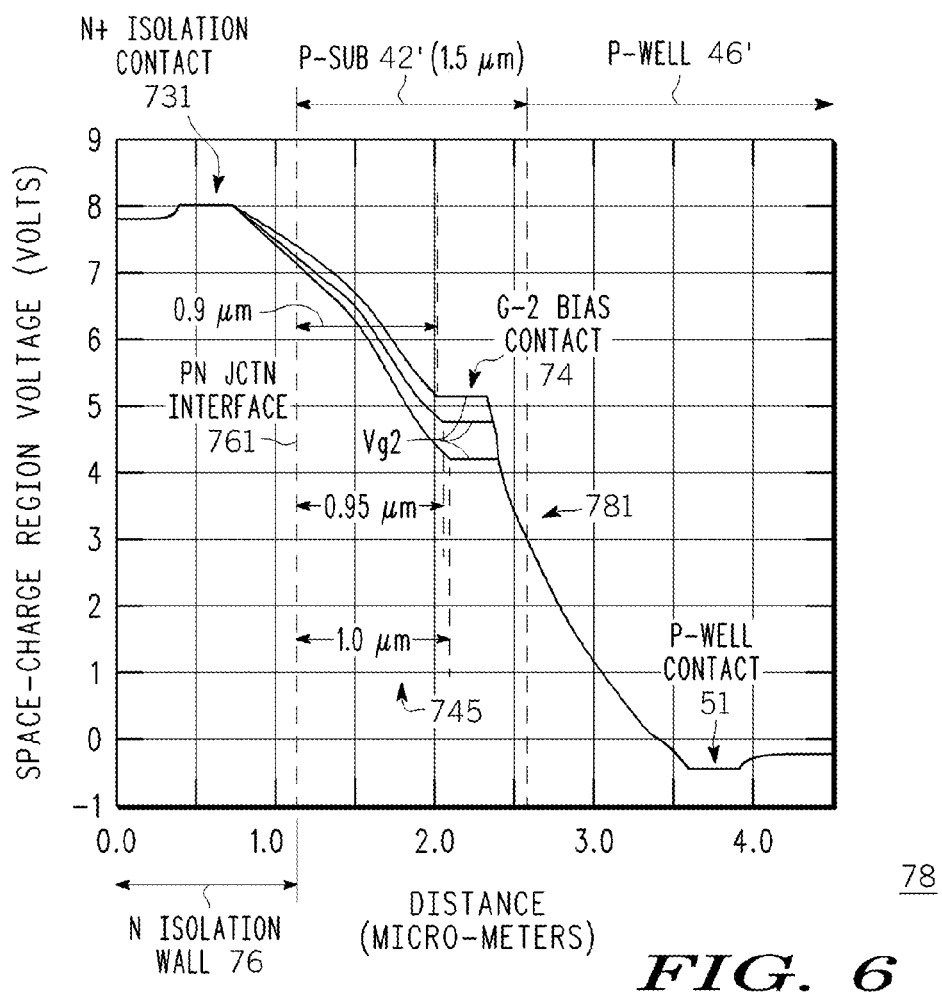
FIG. 6 is a plot of the voltage within a reverse biased PN junction as a function of lateral distance perpendicular to the junction, illustrating how Vg2 of different magnitudes may be obtained by choosing the location of the second gate bias contact relative to the PN junction interface.

FIG. 6 shows plot 78 of the space charge region voltage within a reverse biased PN junction of the type described herein, as a function of lateral distance 745 perpendicular to the junction (e.g. along line 751 in FIG. 5), illustrating how Vg2 of different magnitudes may be obtained by choosing the location of second gate bias connection 74 relative to PN junction interface 761 and the magnitude of Vbias. FIG. 6 corresponds to the arrangement shown by connection 741 of FIG. 5, but useful results can also be obtained for alternative connections 742 and 743. In the example of connection 741, PN junction interface 761 between isolation wall 76 and P-SUB region 42' is located approximately one micro-meter from isolation wall contact 731. Since P-SUB region 42' and P-well 46' have significantly lower doping density than isolation wall 76 (e.g., about $\geq 10^1$ lower and preferably about $\geq 10^2$ lower), voltage Vbias is spread across these regions, as indicated by curves 781 of FIG. 6. The location of second gate bias contact 74 was varied slightly relative to PN junction interface 761, that is, at distances of about 0.9, 0.95 and 1.0 micro-meters from PN junction interface 761. This yielded values of Vg2 between about 4.2 to 5.2 volts for Vbias=7.5 volts and Vref=0 volts, or roughly between about 54% and 67% of Vbias. Stated another way, Vg2 is usefully equal to about 50-70% of Vbias, conveniently about 55-65% of Vbias and preferably about 60% of Vbias, where Vbias approximately equals the maximum operating voltage of the device Vdmax. Since the drop in voltage as a function of distance is approximately linear, these same percentages can be approximately applied to the space charge width to determine the appropriate location of bias contact 74 to obtain the desired second gate bias voltage Vg2. Stated another way, it is desirable to choose Vg2 so that the electric field beneath silicide blocking region 62, 104 is reduced to about 2E5 volts/cm or less while limiting the electric field under G2 to about 5E5 volts/cm or less.

It is desirable that P-SUB region 42, 42' is relatively lightly doped, that is, in the range of about ~1E14 to ~5E15 cm$^{-3}$, preferably about $\leq$~1E15 cm$^{-3}$, but higher or lower values can also be used. P-well 46, 46' is desirably more heavily doped, that is, in the range of about 5E16 cm$^{-3}$ to 1E19 cm$^{-3}$. P-type pocket region 58 is desirably even more heavily doped, that is, in the range of about ~1E18 cm$^{-3}$ to 1E19 cm$^{-3}$. Boron is a suitable dopant for these P-type regions. N-type vertical implant region 53 is desirably doped in the range of about ~9E18 cm$^{-3}$ to ~9E19 cm$^{-3}$. Drift space 44, is desirably doped in the range of about 1E16 to ~1E18 cm$^3$. N+ source region 50 and N+ drain region 48 are desirably highly doped, as for example, to about ~1E20 cm$^{-3}$ or higher or stated another way, so as to have a sheet resistance of about 10 Ohms per square or less. Arsenic or phosphorous are suitable N-type dopants. In general, it is desirable that source region 50 be more heavily doped than P-type pocket region 58. Shallow N-well regions 49 and 52 are desirably doped to a level intermediate between the doping of N-drift 44 and N+ drain region 48 or N+ source region 50. Desirable doping levels for regions 49 and 52 are in the range of about 5E17 to 1E19 cm$^{-3}$. Arsenic or phosphorous are suitable dopants for regions 49 and 52. As noted earlier, P-type buried layer (PBL) 43 may be included in some implementations, but is not essential to the present invention. When included, PBL 43 is desirably doped in the range of about 1E17 to 5E17 cm$^{-3}$, but higher and lower doping can also be used. NBL 41 is desirably doped in the range of about 5E18 to 5E19 cm$^{-3}$. N-type isolation wall 76 is desirably doped to have a concentration of about 1E18 cm$^{-3}$ to 1E19 cm$^{-3}$. As will be subsequently explained, it s desirable to provide more heavily doped contact regions therein.

Stated alternatively, the relative doping of the various regions in devices 40, 60 may be described in relative orders of magnitude as follows:

The doping of N-drift 44 should be about $10^1$-$10^3$ greater than the doping of P-substrate region 42, 42';

The doping of P-well 46 should be about $10^1$-$10^3$ greater than the doping of P-substrate region 42, 42';

The doping of HALO pocket 58 should be about $10^0$-$10^2$ greater than the doping of P-well 46, 46', but less than the doping of N+ source region 50.

The doping of vertical N-type implant region 53 should be about $10^{0.5}$ to $10^1$ greater than the doping of HALO pocket 58, but less than the doping of source region 50; and The doping of N-type shallow well regions 49, 52 should be about $10^1$-$10^2$ greater than the doping of N-drift 44, but less than the doping of N+ drain region 48 or N+ source region 50.

FIGS. 7-17 illustrate schematically, in cross-sectional view, manufacturing stages 80-90 in accordance with still further embodiments of the invention for fabricating the semiconductor device of FIGS. 2 and/or 3. For brevity, many conventional steps will only be mentioned briefly herein or will be omitted entirely without providing the well known process details. Structures 800-900 result from manufacturing stages 80-90 respectively. The discussion of the various regions that make up devices 40, 60 in FIGS. 2-3 and the relative doping types and doping concentration of such regions are included herein by reference and FIGS. 7-17 should be considered in conjunction with FIGS. 2-3 and 5-6. As noted earlier, the manufacturing stages of FIGS. 7-17 are, for convenience of explanation and not intended to be limiting, described as for an N-channel device, but persons of skill in the art will understand that, for example, by substituting doping of opposite conductivity type for the various regions, P-channel and other types of devices may also be fabricated.

Figure 7:
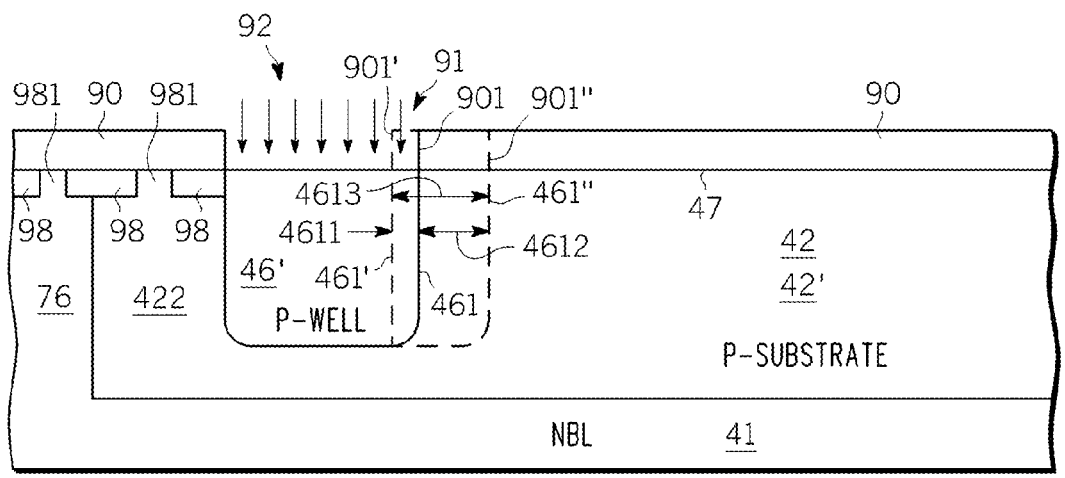
FIGS. 7-17 illustrate schematically, in cross-sectional view, method stages in accordance with still further embodiments of the invention for fabricating the LDMOS devices of FIGS. 2 and 3.

Referring now to manufacturing stage 80 of FIG. 7, supporting substrate 41 is provided. Substrate 41 may be a semiconductor of, for example and not intended to be limiting, silicon or other type IV or III-V or II-VI or organic semiconductor or combinations thereof, and may be in the form of a single crystal or polycrystalline or of a layer that has been formed on another substrate. Silicon-on-insulator (SOI) is a non-limiting example of such an alternative structure. For convenience of description, it is assumed herein that substrate 41 includes N-type buried isolation layer (NBL) 41 of FIGS. 2-3 underlying P-substrate region 42, 42', but this is not essential since other types of isolation may also be used. For convenience of explanation, unless otherwise noted, it is assumed that a device of the type illustrated in FIG. 3 is being fabricated. Persons of skill in the art will understand based on the description herein how to modify the sequence illustrated in FIGS. 7-17 to achieve a device of the type illustrated in FIG. 2, for example, by relocating the subsequent masking operations for forming P-well 46, 46' and N-drift 44. P substrate region 42' having upper surface 47 is formed on substrate 41. Region 42' may be an inherent part of substrate 41 or may, for example, be an epitaxial layer. NBL 41 may be provided by implantation through P-substrate region 42, 42' or may be part of the original substrate on which P-substrate region 42, 42' is formed, for example, by epitaxy. Either arrangement is useful. Isolation wall 76 shown in FIGS. 5 and 7-17 is provided using means well known in the art. Oxide isolation regions 98 are conveniently provided in connection with isolation wall 76. Portion 422 of P-SUB 42, 42' identifies the location where the space-charge region is intended to be formed in this example. Other dielectrics may be used besides, for example, silicon oxide. Openings 981 in oxide isolation regions 98 are later used to provide ohmic contacts to isolation wall 76 and P-SUB 42, 42'. Means and methods for forming such isolation regions are well known in the art.

Mask 90 of, for example and not intended to be limiting, photo-resist or oxide or other dopant resistant material is provided on surface 47. Mask 90 has opening 91 through which, for example, P-type ion implantation 92 or other dopant is provided to form P-well 46' having lateral edge 461 extending to surface 47. By selecting different locations (e.g., 901, 901', 901") of lateral edge 901 of mask 90 relative to the location of the subsequent mask used to define gate 56, lateral edges 461, 461', 461" of P-well 46' are obtained. For convenience of explanation and not intended to be limiting, it is assumed hereafter that location 901 was selected. P-well 46' is desirably doped to an approximate concentration in a range of about 5E16 $cm^{-3}$ to 1E19 $cm^{-3}$, preferably about 1E17 $cm^{-3}$ to 5E18 $cm^{-3}$, wherein the higher the doping concentration the better the ability for P-well 46' to prevent bulk punch-through. This results in structure 800.

Figure 8:
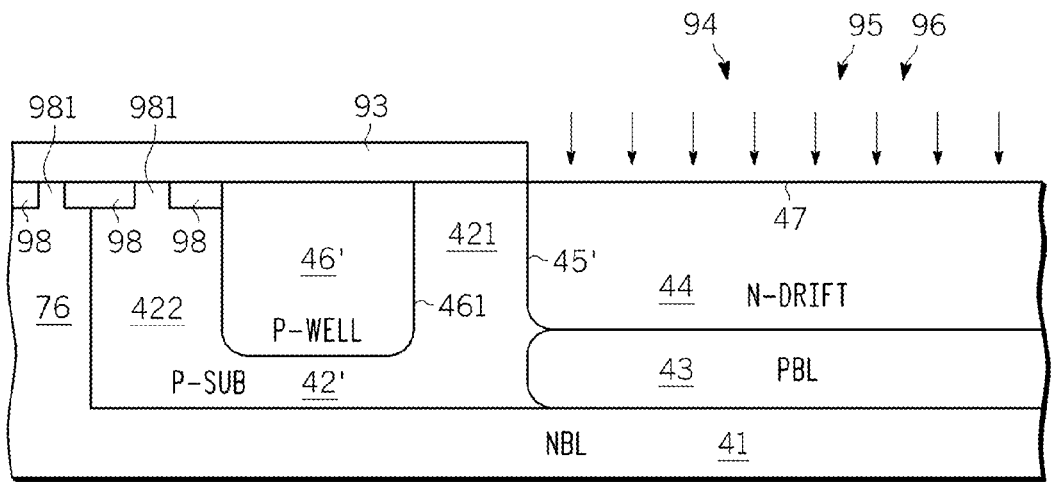

In manufacturing stage 81 of FIG. 8, mask 90 on surface 47 of structure 800 is removed and surface 47 is covered with mask 93 of, for example and not intended to be limiting, photo-resist or oxide or other dopant resistant material. Mask 93 has opening 94 through which, for example, high energy P-type ion implantation 95 or other dopant is provided in some implementations to form P-type buried layer (PBL) 43 and/or lower energy N-type ion implantation 96 or other dopant is provided to form N-type drift space or region 44 (hereafter N-drift 44). Both P and N implants are desirably made through opening 94 of mask 90 to form PBL 43 and N-drift 44 respectively. The relative implant energy is adjusted so that PBL 43 lies beneath N-drift 44. N-drift 44 creates with P-type region 42', PN junction 45' extending to surface 47. PBL 43 is conveniently doped in the range of about 1E17 to 5E17 $cm^{-3}$. Drift region 44 is conveniently doped in the range of about 1E16 to 1E18 $cm^3$. Structure 810 results. Manufacturing stages 80 and 81 and implants 95, 96 may be performed in either order.

Figure 9:
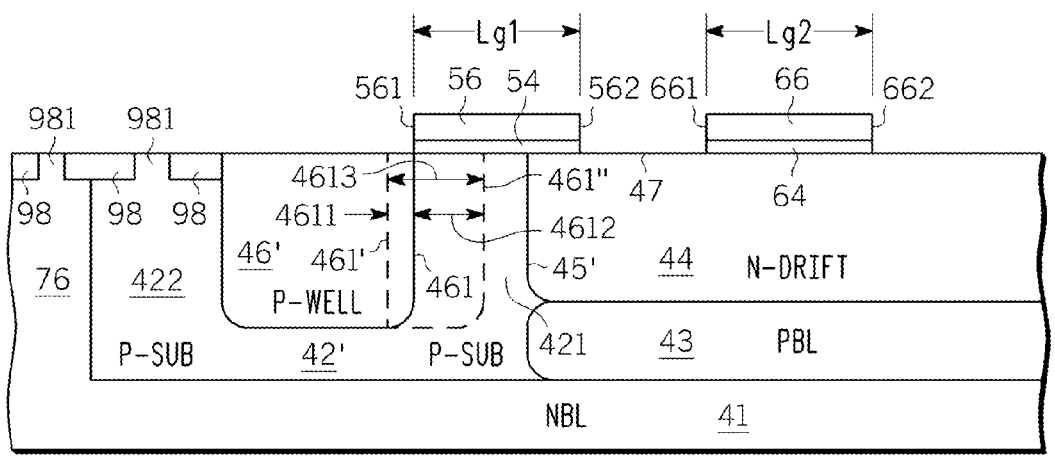

In manufacturing stage 82 of FIG. 9, mask 93 is removed from structure 810 and gate dielectric 54 and gate 56 and gate dielectric 64 and gate 66 are formed and patterning using a conventional hard and/or soft mask (not shown) and associated etching steps. Gate dielectrics 54, 64 may be a thermally grown silicon dioxide formed by heating substrate 42, 42' in an oxidizing ambient, or may be a deposited insulator such as a silicon oxide, silicon nitride, silicon oxy-nitride, high dielectric constant insulators such as HfSiO, or the like, and may have the same or different thickness, according to the properties desired in the finished device. In a preferred embodiment, the thicknesses of gate dielectrics 54, 64 are substantially the same and typically 1-50 nanometers (nm) in thickness depending on gate and drain operating voltage, with about 8-10 nanometers being preferred. Deposited dielectrics or insulators can be formed by chemical vapor deposition (CVD), low pressure chemical vapor deposition (LPCVD), plasma enhanced chemical vapor deposition (PECVD), atomic layer deposition (ALD) or by other means. As previously explained, lateral edge 561 of gate 56 can be located anywhere within distance 4613 relative to P-well 46' depending upon where P-well edge 461', 461, 461" has been placed, that is, in "substantial alignment" with edge 461 of P-well 46'. In a preferred embodiment, gate edge 561 is located as close to being aligned with edge 461 of P-well 46' as is permitted by the lithographic alignment system being used, but at least within the boundaries of distances 4611 and/or 4612. For convenience of description and not intended to be limiting, in the figures that follow, gate edge 561 and P-well edge 461 are shown as being aligned. A photoresist or hard mask layer (not shown) is conveniently used and lithographically patterned to define gates 56, 66 and gate dielectrics 54, 64. Preferably gate 56 has length Lg1 in the source-drain direction equal to or greater than the minimum line width allowable by the design rules used to lay out the integrated circuit of which LDMOS device 40, 60 may be a part. Gate 66 has length Lg2 in the source-drain direction and may be about the same or different then Lg1, according to the desired device characteristics. The polycrystalline silicon typically used for gates 56, 66 and the silicon oxide typically used for gate dielectrics 54, 64 can be etched in the desired pattern by, for example, plasma etching in a Cl or $HBr/O_2$ chemistry. Structure 820 results.

Figure 10:
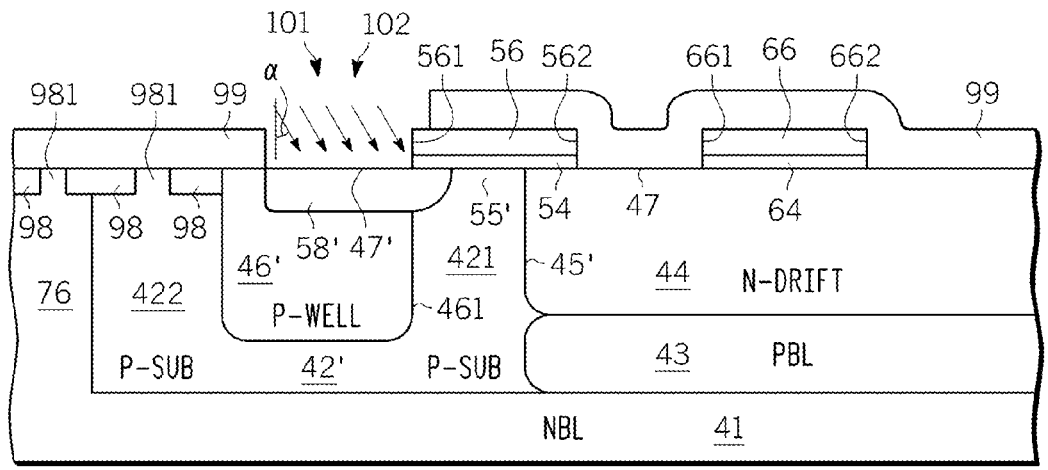

In manufacturing stage 83 of FIG. 10, structure 820 is provided with mask 99 having opening 101 through which P-type HALO implant 102 is made at angle α to form P-type layer or region 58'. Region 58' is the precursor to region 58 of FIG. 3, also referred to as HALO region 58 or HALO pocket 58. Following formation of mask 99, structure 820 is preferably subjected to an angled unidirectional ion implantation process. The angled unidirectional ion implantation is preferably performed using ions of the same doping material as for P-region 42', such as germanium (Ge), arsenic (As), phosphorous (P), boron (B), and the like depending upon the conductivity type of the device being formed, except that HALO implant region 58' is more heavily doped than P-SUB region 42'. In this exemplary embodiment for forming an N-channel device, HALO implant region 58' is doped with boron ions to a concentration level in a range of about 1E18 to 1E19 $cm^{-3}$. The ion implantation process conveniently uses boron ions that are directed at surface 47' (i.e., the surface closest to a source region) of structure 830 at an acute angle α from an axis that is perpendicular to surface 47'. Angle α is usefully at least as great as about 7 degrees and less than about 90 degrees. In a preferred embodiment, the tilted angle implant is performed at between about 45-60 degrees to form HALO implant region 58'. Boron ions are preferably implanted at energy of about 30 KeV and at an implant doping concentration of about $5 \times 10^{18}$ $cm^{-3}$. It will be appreciated that, because such ion implantation is unidirectional and is oriented at an angle, ions will be implanted into surface 47' of structure 830 that is exposed to or facing the source of the ions. The angled implant is directed to the source side of gate 56 and forms HALO implant region 58' (the precursor to finished HALO pocket 58 of FIGS. 3 and 17), where gate 56 serves as a partial mask. Gate 56 provides self-alignment of HALO implant region 58'. Structure 830 results. Subsequent to the formation of halo implant region 58', in further manufacturing stage 84 of FIG. 11, N-type source extension region 53' is desirably formed, e.g. of a phosphorus ions 103 that are implanted at angle α=0 degree with an energy of about 30 KeV and at an implant doping concentration level in a range of about 9E18 $cm^{-3}$ to about 9E19 $cm^{-3}$. N-type region 53' is the precursor to region 53 of the finished device and serves to connect N+ source region 50 to channel 55' (see FIGS. 3). Structure 840 results.

Figure 11:
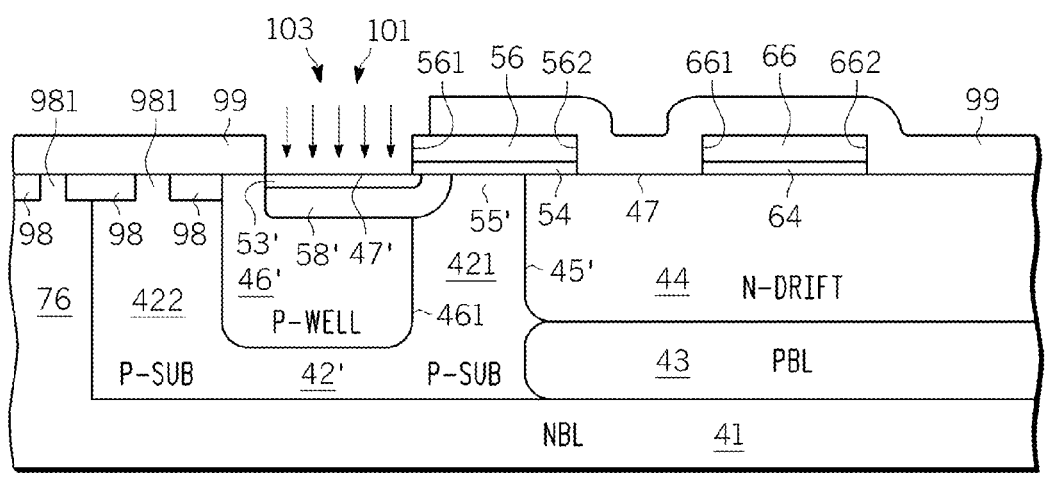
Figure 12:
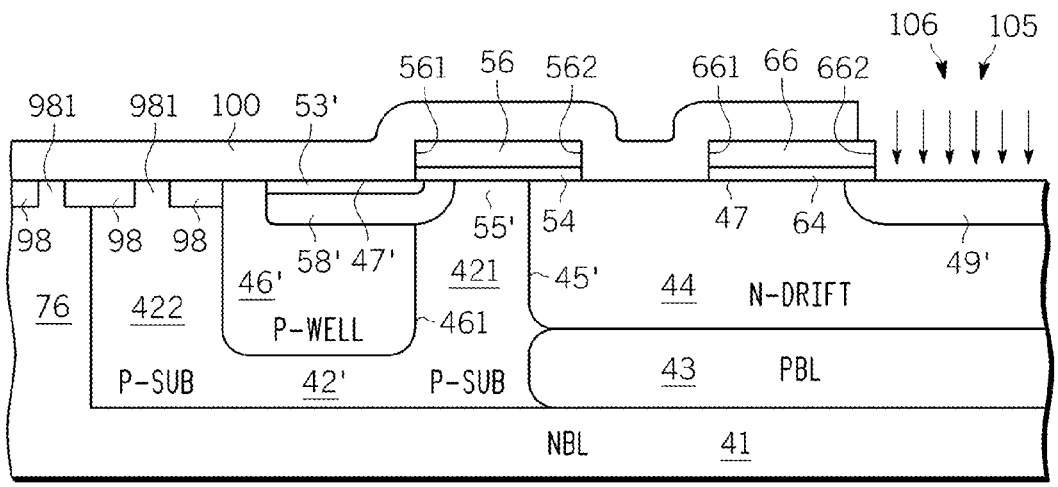
Figure 13:
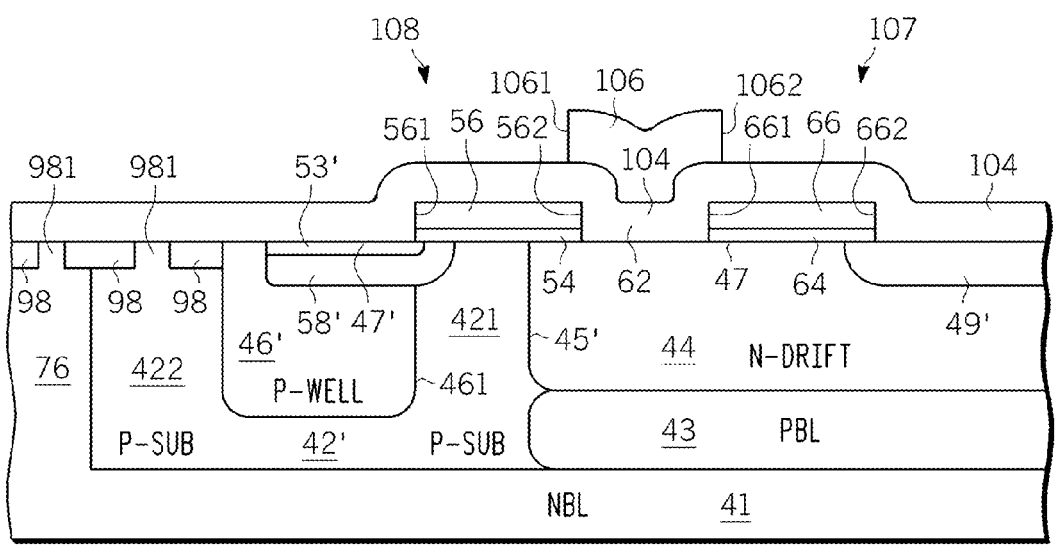

In manufacturing stage 85 of FIG. 12, mask 99 is removed from structure 840 and mask 100 with opening 105 is provided. N-type ions 106 are implanted or otherwise introduced into N-drift 44 through opening 105 to form N-type region 49' of doping concentration intermediate between that of N-drift 44 and subsequently formed drain region 48 (see FIGS. 2 and 15). Structure 850 results. (Persons of skill in the art will understand based on the description herein that when formation of device type 40 of FIG. 2 is desired, that manufacturing stages 83-84 of FIGS. 10-11 are omitted (no HALO pocket) and N-type region 52 is formed during manufacturing stage 85 of FIG. 12 at the same time as N-type region 49', using an appropriate mask.) In manufacturing stage 86 of FIG. 13, blanket dielectric layer 104 of, for example and not intended to be limiting, silicon nitride is provided on surface 47 and over gates 56, 66. After patterning and etching, in manufacturing stage 87 of FIG. 14, layer 104 will provide side-wall spacer 57, silicide blocker 62 and side-wall spacer 65 (e.g., see FIGS. 2-3 and 14). Continuing with manufacturing stage 86 of FIG. 13, mask 106 is formed over dielectric layer 104 and patterned to provide openings 107, 108. Photoresist is a non-limiting example of a material suitable for forming mask 106. Edge 1061 of mask 106 should be located slightly to the left of lateral edge 562 of gate 56 and edge 1062 of mask 106 should be located slightly to the right of edge 661 of gate 66, so that, after etching of layer 104 laterally outside of mask 106 (in manufacturing stage 87 of FIG. 14), lateral gate edges 562 and 661 remain covered by some of the material of layer 104. Structure 860 results from manufacturing stage 86.

Figure 14:
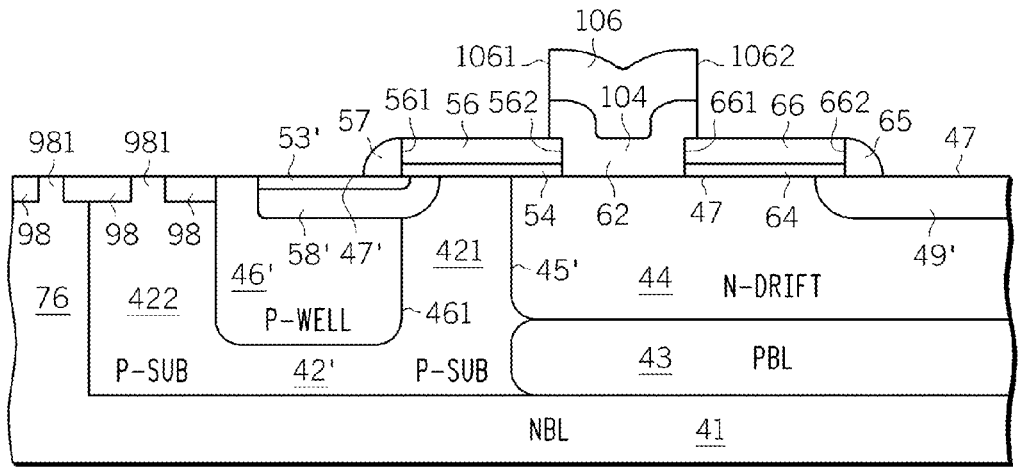
Figure 15:
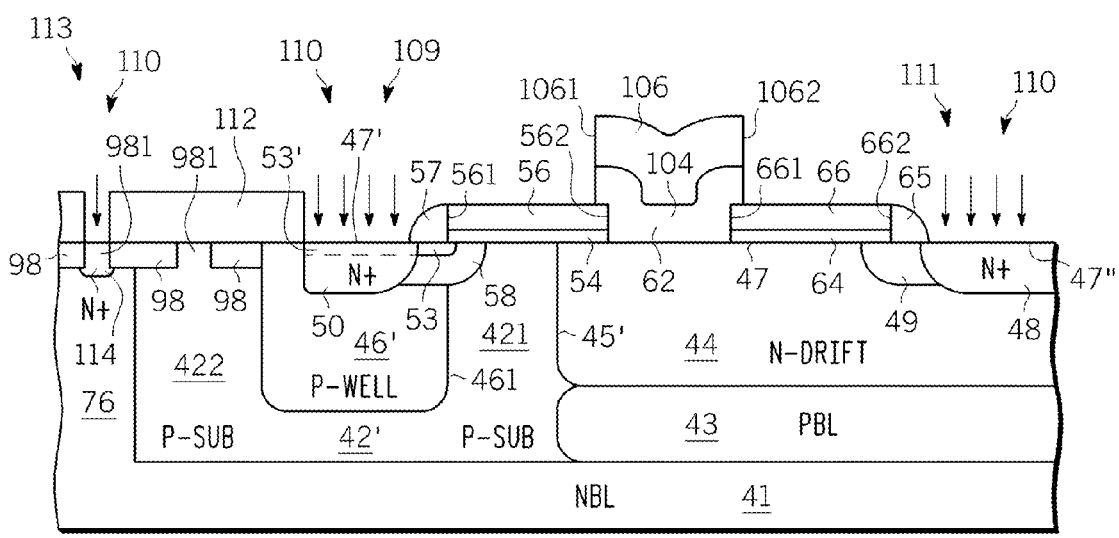

In manufacturing stage 87 of FIG. 14, dielectric layer 104 of structure 860 is anisotropically etched so as to leave behind sidewall spacers 57, 65 and silicide blocker 62. Structure 870 results. In manufacturing stage 88 of FIG. 15, mask 106 is optionally removed and N-type ions or other dopant 110 introduced into structure 870 through surface 47' of source-side opening 109 and through surface 47" of drain-side opening 111, thereby forming N+ source region 50 and N+ drain region 48, respectively. Opening 113 is also provided through mask 112 above isolation wall 76 so that dopant 110 can provide N+ contact region 114 to N-type isolation wall 76. Ion implantation is preferred. Source 50 and drain 48 may be shallower, deeper or the same depth as N-type region 53', P-type HALO region 58 and/or shallow N-well region 49 depending upon the particular device being designed and compatibility with other devices on the same chip. Either arrangement is useful. The source-gate spacing is determined by sidewall spacer 57 less any lateral diffusion associated with the doping step, e.g., implant and anneal. The spacing between second gate 66 and drain 48 (see FIGS. 2-3) is determined substantially by the location of edge 662 of second gate 66 plus sidewall spacer 65, less any lateral diffusion associated with the doping step, e.g., implant and anneal. Since lateral diffusion associated with the implant steps is generally small and well known, the gate-drain separation is well controlled. Structure 880 of FIG. 15 results, conforming in this example, to device 60 of FIG. 3. It will be observed that the source region 50 is self-aligned with edge 561 of gate 56 to within the width of side-wall spacer 57. Similarly, drain region 48 is self aligned with edge 662 of gate 66 to within the width of side-wall spacer 65. As used herein the terms "substantially aligned" and "proximate" are intended to include the small differentials provided by such side-wall spacers.

Figure 16:
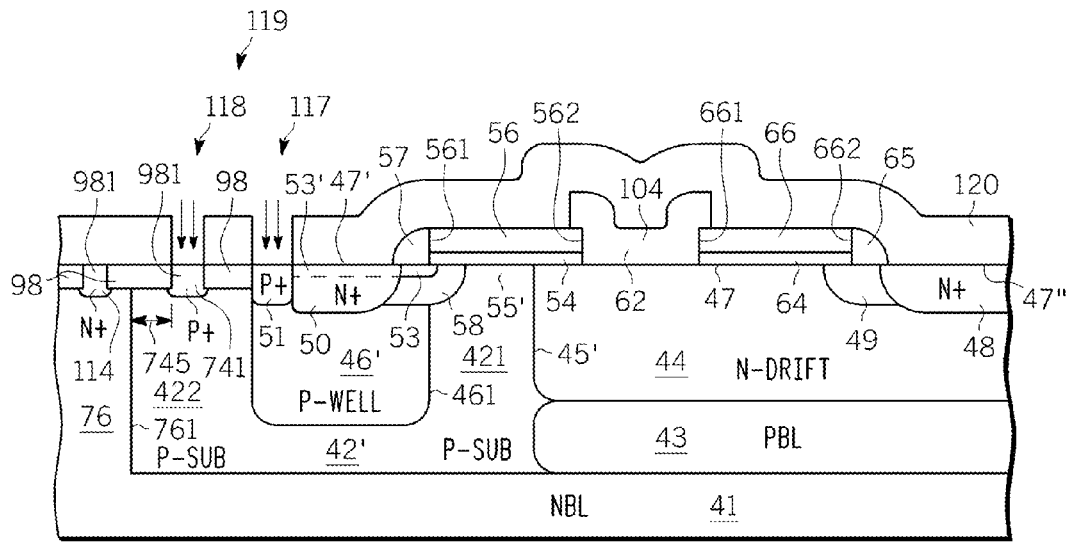
Figure 17:
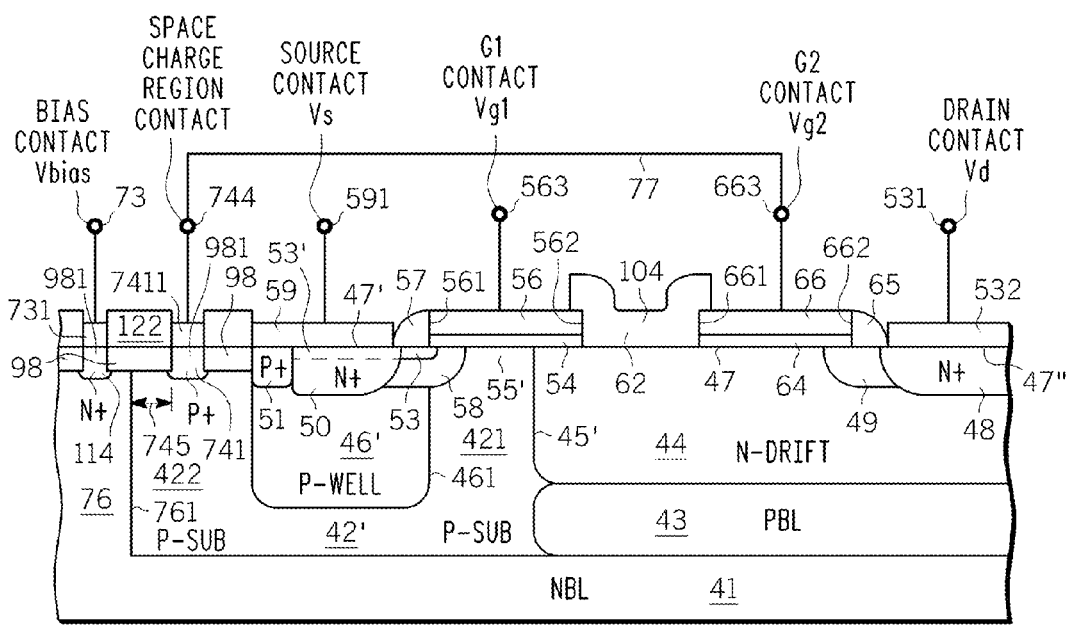

In manufacturing stage 89 of FIG. 16 (see also FIGS. 5-6), mask layer 120 of photo-resist or a refractory material or both is provided having openings 117 and 118 through which P-type doping 119 is provided so as to form P+ contact region 51 in communication with P-well 46' and P+ bias contact 741 in communication with P-SUB region 42' at distance 745 from PN junction interface 761. P+ bias contact 741 is located in region 422 in which a space charge region will form adjacent interface 761 in P-SUB region 42, 42' or a combination of P-SUB region 42, 42' and P-well 46, 46'. As explained in connection with FIGS. 5-6, spacing 745 in combination with Vbias on isolation wall 76, determines the voltage Vg2 appearing on contact region 741 and coupled to second gate 66 vial link 77 (see FIGS. 5 and 17). Structure 890 results. In manufacturing stage 90 of FIG. 17, openings are formed in dielectric layer 122 over isolation wall 76 and portion 422 of P-SUB 42, 42'. Ohmic contact 731 is formed to N+ region 114 of isolation wall 76, ohmic contact 7411 is formed to P+ region 741, ohmic contact 59 is formed to N+ source region 50 and P+ contact region 51, and ohmic contact 532 is formed to drain region 48. Electrodes are then provided to such contact regions so that electrode 73 for isolation wall 76 may be coupled to voltage source Vbias, electrode 744 of Vg2 bias tap 74 can be coupled via link 77 to terminal 663 of second gate 66, terminal 563 provides conductive access to first gate 56 and terminal 531 provides conductive access to drain connection 532, and terminal 591 is coupled to contact 59.

It will be understood by those of skill in the art based on the description herein that in order to form P-channel devices in alternate embodiments, region 42, 42' becomes N-type, well 46, 46' becomes N-type, drift space 44 becomes P-type, and so forth for the other regions described above. Accordingly, the more general terms "first conductivity type" and "second, opposite conductivity type" can be used to describe these regions, wherein the terminology "first conductivity type" and "second, opposite conductivity type" are intended to refer to either P or N conductivity types. For example, "first conductivity type" can be either N or P type, and "second, opposite conductivity type" then refers to the opposite P or N conductivity type respectively.

Devices formed according to the structure and method of the invention have significant advantages over the prior art. For example, the HCI is much reduced because the peak electric field under silicide blocker region 62 can be reduced by ~50% or more. Further, Rdson is significantly lower, such that the Rdson*Area product is ~30% lower compared to prior art single gate devices and the current gain can be enhanced by ~75% or more. In addition, the devices are able to operate at higher voltages and higher speeds without the degradation observed with prior art single gate devices. It has been further found that bias voltage Vg2 obtained using space-charge contact 74 described herein, especially of the variety illustrated by contacts 741 or 742 (see FIG. 5) are very stable and substantially independent of the drain voltage. For example, less than about 60 milli-volts variation was observed for Vd in the range of ~0 to 7.5 volts with Vbias of ~7.5 volts. These are significant advantages.

According to a first embodiment, there is provided a method of fabricating a semiconductor device, comprising the steps of, providing a semiconductor having a substrate region of a first conductivity type and first impurity concentration, extending to a surface of the semiconductor, impurity doping a first region of the first conductivity type and a second dopant concentration in a first portion of the substrate region to form a first doped well extending substantially to the surface, impurity doping a second region of a second, opposite conductivity type and a third dopant concentration within a second portion of the substrate region different from the first portion of the substrate region, thereby forming a second doped well extending substantially to the surface, forming a first gate dielectric surmounted by a first gate, at least partially overlying the first region or the substrate region or both, forming a second gate dielectric surmounted by a second gate, substantially overlying the second region and spaced apart from the first gate; impurity doping a third region of the second conductivity type and a fourth impurity concentration in the substrate region, adapted when biased to form a depletion region at least partly in the substrate region or in a combination of the substrate region and the first region; forming a bias contact to a part of the depletion region; and electrically coupling the bias contact to the second gate. In a further embodiment, the step of impurity doping a third region, comprises, forming as the third region, a lateral isolation wall of the second conductivity type at least partly encompassing the substrate region. In a still further embodiment, the step of impurity doping a third region, comprises, forming as the third region, a drain region. In a yet further embodiment, the depletion region has a width when biased and the bias contact is located at a distance from the third region of about 50-75% of the width of the depletion region. In a still yet further embodiment, the fourth dopant concentration is at least ten times the first dopant concentration. In a yet still further embodiment, the step of forming a bias contact, comprises, locating the bias contact within the depletion region so that when the depletion region is formed by biasing the third region, the voltage at the bias contact is in the range of about 50-75% of the maximum operating voltage of the device. In an additional embodiment, the step of impurity doping the second region, comprises, forming the second region spaced apart from the first region by a portion of the substrate region so that a PN junction formed between the second region and the substrate region extends substantially to the surface, and the step of forming a first gate comprises forming the first gate substantially overlying a part of the substrate region. In a still additional embodiment, the second region substantially in contact with the first region so that a PN junction therebetween extends substantially to the surface, and the step of forming a first gate comprises, forming the first gate mostly overlying the first region. In a yet additional embodiment, the bias contact is located within the depletion region, so that an electric field at a surface of the portion of the substrate region is reduced.

According to a second embodiment, there is provided a semiconductor device, comprising, a semiconductor substrate of a first conductivity type and first dopant concentration and having a surface, a first well of the first conductivity type and second dopant concentration located in the substrate, a second well of a second, opposite, conductivity type and third dopant concentration located in the substrate, separated from or in contact with the first well and forming a PN junction with the first well or the substrate, which PN junction extends substantially to the surface, a third region of the second conductivity type and a fourth dopant concentration, located in the substrate, extending substantially to the surface and laterally separated from the first well, and adapted when biased to form a space charge region at least partly in the substrate or the first well or in a combination thereof, a first gate overlying a part of the first well or a part of the substrate between the first and second wells or both, a second gate spaced apart from the first gate and overlying at least a part of the second well, and an ohmic contact to the substrate within the space charge region and electrically coupled to the second gate. In a further embodiment, the ohmic contact to the substrate within the space-charge region is separated from the third region by a distance such that the ohmic contact sees a voltage when the third region is biased of about 50-75% of the maximum rated operating voltage of the device. In a still further embodiment, the device further comprises, a source of the second conductivity type in the first well, and a drain region of the second conductivity type in the second well. In a yet further embodiment, the third region is a lateral isolation wall. In a yet still further embodiment, a silicide blocking layer overlies the surface between the first and second gates and a voltage applied to the second gate by the ohmic contact to the substrate reduces, during operation, a maximum electric field at the surface underlying the silicide blocking layer compared to the maximum electric field underlying the silicide blocking layer when no second gate is present In a still yet further embodiment, one lateral edge of the second gate and one lateral edge of the drain are substantially aligned, and one lateral edge of the first gate and one lateral edge of the source are substantially aligned. In another embodiment, the fourth dopant concentration is at least ten times larger than the first dopant concentration.

According to a third embodiment there is provided an LDMOS device, comprising, a semiconductor substrate of a first conductivity type and first concentration, having a principal surface, a source region of a second, opposite, conductivity type extending to the principal surface, a drain region of a second, opposite, conductivity type extending to the principal surface and spaced apart from the source region, a first gate, adapted to receive a control signal and located above a first portion of the principal surface proximate the source region, a second gate, adapted to receive a bias voltage Vg2 and located above the principal surface proximate the drain region and spaced apart from the first gate, a further region of the second conductivity type and further dopant concentration greater than the first concentration, located in the substrate and adapted to form a space charge region in the substrate when the further region receives a voltage Vbias, and a body contact coupled to the second gate for providing voltage Vg2 to the second gate, wherein the body contact is located within the space charge region spaced a predetermined distance from the further region, wherein the space charge region acts as a voltage divider so that Vg2 provided by the body contact is a predetermined fraction of Vbias applied to the further region. In a further embodiment, the predetermined fraction is in the range of 50-75% of Vbias. In a still further embodiment, the predetermined fraction is about 55-65% of Vbias. In a yet further embodiment, the further region is part of a lateral isolation wall and the further dopant concentration is >10 times the first dopant concentration.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor device, comprising:
   a semiconductor substrate of a first conductivity type and first dopant concentration and having a surface;

a first well of the first conductivity type and second dopant concentration located in the substrate;
a second well of a second, opposite, conductivity type and third dopant concentration located in the substrate, separated from or in contact with the first well and forming a PN junction with the first well or the substrate, which PN junction extends substantially to the surface;
a third region of the second conductivity type and a fourth dopant concentration, located in the substrate, extending substantially to the surface and laterally separated from the first well, and adapted when biased to form a space charge region at least partly in the substrate or the first well or in a combination thereof;
a first gate overlying a part of the first well or a part of the substrate between the first and second wells or both;
a second gate spaced apart from the first gate and overlying at least a part of the second well; and
an ohmic contact to the substrate within the space charge region and electrically coupled to the second gate.

2. The device of claim 1, wherein the ohmic contact to the substrate within the space-charge region is separated from the third region by a distance such that the ohmic contact sees a voltage when the third region is biased of about 50-75% of the maximum rated operating voltage of the device.

3. The device of claim 1, further comprising:
a source of the second conductivity type in the first well; and
a drain region of the second conductivity type in the second well.

4. The device of claim 3, wherein one lateral edge of the second gate and one lateral edge of the drain are substantially aligned, and one lateral edge of the first gate and one lateral edge of the source are substantially aligned.

5. The device of claim 1, wherein the third region is a lateral isolation wall.

6. The device of claim 1, wherein a silicide blocking layer overlies the surface between the first and second gates and a voltage applied to the second gate by the ohmic contact to the substrate reduces, during operation, a maximum electric field at the surface underlying the silicide blocking layer compared to the maximum electric field underlying the silicide blocking layer when no second gate is present.

7. The device of claim 1, wherein the fourth dopant concentration is at least ten times larger than the first dopant concentration.

8. A laterally diffused metal oxide semiconductor (LDMOS) device, comprising:
a semiconductor substrate of a first conductivity type and first concentration, having a principal surface;
a source region of a second, opposite, conductivity type extending to the principal surface;
a drain region of a second, opposite, conductivity type extending to the principal surface and spaced apart from the source region;
a first gate, adapted to receive a control signal and located above a first portion of the principal surface proximate the source region;
a second gate, adapted to receive a bias voltage Vg2 and located above the principal surface proximate the drain region and spaced apart from the first gate;
a further region of the second conductivity type and further dopant concentration greater than the first concentration, located in the substrate and adapted to form a space charge region in the substrate when the further region receives a voltage Vbias; and
a body contact coupled to the second gate for providing voltage Vg2 to the second gate, wherein the body contact is located within the space charge region spaced a predetermined distance from the further region, wherein the space charge region acts as a voltage divider so that Vg2 provided by the body contact is a predetermined fraction of Vbias applied to the further region.

9. The device of claim 8, wherein the predetermined fraction is in the range of 50-75% of Vbias.

10. The device of claim 9, wherein the predetermined fraction is about 55-65% of Vbias.

11. The device of claim 8, wherein the further region is part of a lateral isolation wall and the further dopant concentration is >10 times the first dopant concentration.

12. A semiconductor device comprising:
a semiconductor having a substrate region of a first conductivity type and first dopant concentration, extending to a surface of the semiconductor;
a first doped well in a first portion of the substrate region and extending substantially to the surface of the semiconductor, wherein the first doped well includes a first impurity-doped region of the first conductivity type and a second dopant concentration;
a second doped well in a second portion of the substrate region that is different from the first portion of the substrate region and extending substantially to the surface of the semiconductor, wherein the second doped well includes a second region of a second, opposite conductivity type and a third dopant concentration;
a third region of the second conductivity type and a fourth doping concentration in the substrate region, wherein the third region is adapted when biased to form a depletion region at least partly in the substrate region or in a combination of the substrate region and the first region;
a first gate dielectric surmounted by a first gate, at least partially overlying the first region or the substrate region or both;
a second gate dielectric surmounted by a second gate, substantially overlying the second region and spaced apart from the first gate; and
a bias contact to a part of the depletion region, wherein the bias contact is electrically coupled with the second gate.

13. The semiconductor device of claim 12, wherein the ohmic contact to the substrate within the space-charge region is separated from the third region by a distance such that the ohmic contact sees a voltage when the third region is biased of about 50-75% of the maximum rated operating voltage of the device.

14. The semiconductor device of claim 12, further comprising:
a source of the second conductivity type in the first well; and
a drain region of the second conductivity type in the second well.

15. The semiconductor device of claim 12, wherein the third region is a lateral isolation wall.

16. The semiconductor device of claim 12, further comprising:
a silicide blocking layer overlying the surface between the first and second gates, wherein a voltage applied to the second gate by the ohmic contact to the substrate reduces, during operation, a maximum electric field at the surface underlying the silicide blocking layer compared to the maximum electric field underlying the silicide blocking layer when no second gate is present.

17. The semiconductor device of claim 12, wherein one lateral edge of the second gate and one lateral edge of the drain are substantially aligned, and one lateral edge of the first gate and one lateral edge of the source are substantially aligned.

18. The semiconductor device of claim 12, wherein the fourth dopant concentration is at least ten times larger than the first dopant concentration.

19. The semiconductor device of claim 12, wherein the depletion region acts as a voltage divider so that Vg2 provided by the bias contact is a predetermined fraction of Vbias applied to the third region.

20. The semiconductor device of claim 19, wherein the predetermined fraction is in a range of 50 percent to 75 percent of Vbias.

* * * * *